United States Patent [19]

Tsuda et al.

[11] 3,754,170

[45] Aug. 21, 1973

[54] INTEGRATED CIRCUIT DEVICE HAVING MONOLITHIC RF SHIELDS

[75] Inventors: Yukio Tsuda, Atsugi-shi, Kanagawa-ken; Shigeo Matsumoto, Sagamihara-shi, Kanagawa-ken; Tadaharu Tsuyuki, Isehara-shi, Kanagawa-ken, all of Japan

[73] Assignee: Sony Corporation, Tokyo, Japan

[22] Filed: Aug. 22, 1972

[21] Appl. No.: 282,859

[30] Foreign Application Priority Data

Aug. 26, 1971 Japan ................................ 46/65272

[52] U.S. Cl....... 317/235 R, 317/234 N, 317/234 G, 317/235 AH, 330/31, 325/319

[51] Int. Cl.......................... H01l 11/00, H01l 15/00

[58] Field of Search......................... 317/234, 4, 5.4, 317/235, 46.1; 330/31

[56] References Cited

UNITED STATES PATENTS

| | | | |
|---|---|---|---|
| 3,373,323 | 3/1968 | Wolfrum et al. | 317/235 AH |
| 3,381,182 | 4/1968 | Thornton | 317/234 N |
| 3,465,210 | 9/1969 | Bertram et al. | 317/234 G |
| 3,518,494 | 6/1970 | James | 317/235 AH |
| 3,611,071 | 10/1971 | Agusta | 317/235 AH |
| 3,614,546 | 10/1971 | Avins | 317/234 N |

FOREIGN PATENTS OR APPLICATIONS

| | | | |
|---|---|---|---|
| 1,204,805 | 9/1970 | Great Britain | 317/235 AH |

*Primary Examiner*—John W. Huckert
*Assistant Examiner*—Andrew J. James
*Attorney*—Lewis H. Eslinger et al.

[57] ABSTRACT

A monolithic, multiple integrated circuit device for use in the radio frequency (RF) stages in a television receiver in which monolithic RF shields are provided to isolate the multiple circuits on the same integrated circuit chip.

9 Claims, 16 Drawing Figures

INTEGRATED CIRCUIT DEVICE HAVING MONOLITHIC RF SHIELDS

BACKGROUND OF THE INVENTION

This invention relates to monolithic integrated circuit (IC) devices in which several circuits are provided on the same integrated circuit chip and more particularly to such circuits as are used in the RF stages of a television receiver.

One difficulty in trying to design monolithic integrated circuit devices for use in the RF circuits of a television receiver is in isolating the high frequency signals which are present in the several circuits on the same IC chip. On such a chip there are commonly several transistor circuits and many leads and lead terminals. These circuits must be carefully designed in order to eliminate RF interference among the leads and lead terminals in each circuit chip otherwise extraneous oscillation and unstable operation are introduced into the circuits.

SUMMARY OF THE INVENTION

The above disadvantages are overcome by the present invention comprising a semiconductor device having a plurality of circuit blocks on a common semiconductor chip and having a plurality of lead terminals to each of the separate circuit blocks on the chip. A plurality of RF shields which are monolithic with the semiconductor chip are provided to isolate each of the separate circuits from the RF fields generated in the other circuits. In one embodiment the header on which the common semiconductor chip is mounted has corresponding integral shielding members which are contacted by the shielding members on the chip. In still another preferred embodiment the integrated shields on the semiconductor chip are connected to highly doped impurity regions within the semiconductor chip to provide a path of low resistance through the chip to eliminate extraneous RF fields.

It is therefore an object of the present invention to provide an integrated, multi-circuit semiconductor chip in which monolithic shields are provided to isolate the RF fields present in each of the individual circuits on the same chip.

The foregoing and other objectives, features, and advantages of the invention will be more readily understood upon consideration of the following detailed description of certain preferred embodiments of the invention, taken in conjunction with the accompanying drawings.

DESCRIPTION OF CERTAIN PREFERRED EMBODIMENTS

Figure 1:
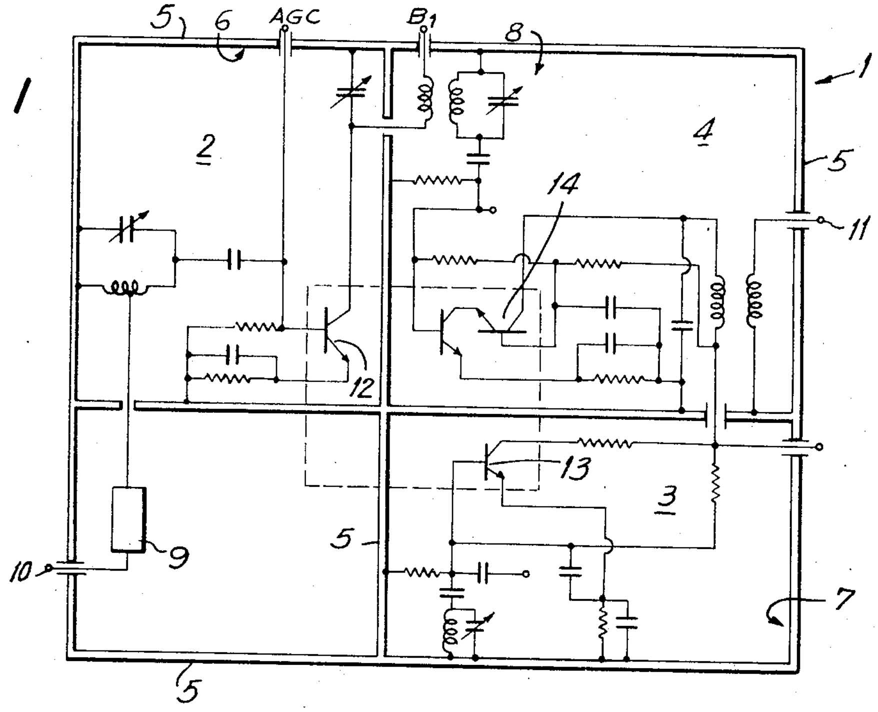
FIG. 1 is a schematic diagram of a television receiver tuning circuit.

Referring now more particularly to FIG. 1 there is shown a television tuner generally designated 1 having an RF amplifier circuit 2, a local oscillator circuit 3, and a mixing circuit 4. The incoming RF signal to the tuner is supplied to a terminal 10 which is connected to a high-pass filter 9. After leaving the filter 9 the RF signal passes through the RF amplifier 2 to the mixing circuit 4. The local oscillator 3 supplies a signal to the mixing circuit 4 and the output from the mixing circuit is obtained at terminal 11.

Each of these circuits is positioned within a cavity in a shielded chassis 5. Thus the RF amplifier circuit is shielded within a cavity 6, the mixing circuit is shielded within a cavity 8, and the local oscillator circuit 3 is shielded within a cavity 7. The RF amplifier circuit utilizes a transistor 12, the mixing circuit utilizes a pair of transistors 14, and the local oscillator 3 utilizes a transistor 13. The details of these circuits will not be described since they are well known in the art. When each of the transistors 12, 13 and 14 are created on a single integrated circuit chip it becomes difficult to isolate the respective transistors so that there will be no leakage of RF signals from one circuit to the other.

Figure 2:
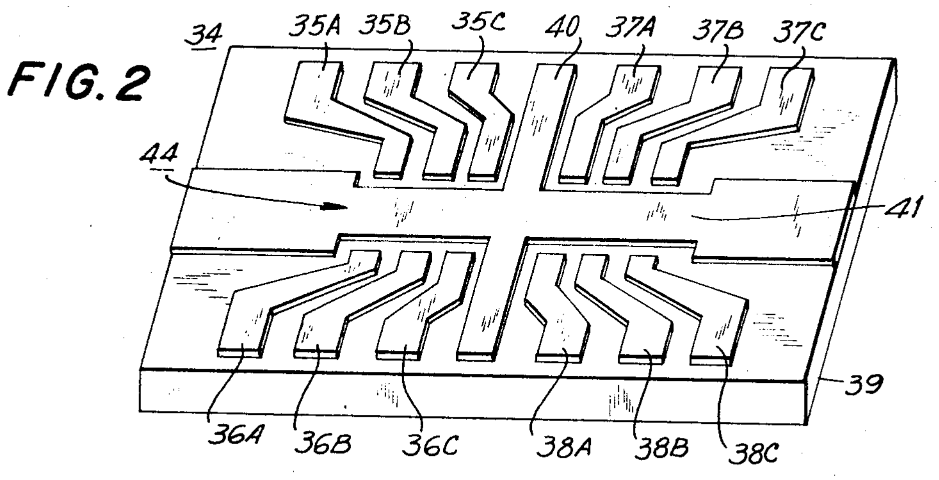
FIG. 2 is a perspective view of a header according to one embodiment of the invention on which the integrated circuit depicted in FIG. 3 is mounted.
Figure 3:
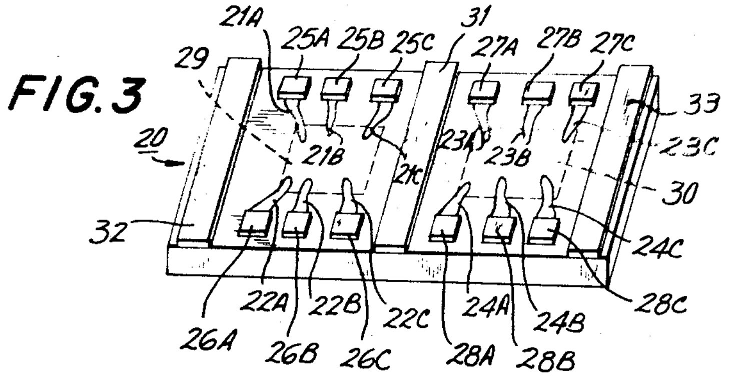
FIG. 3 is a perspective view of the underside of an integrated circuit, which is upsidedown, according to one embodiment of the invention.
Figure 4:
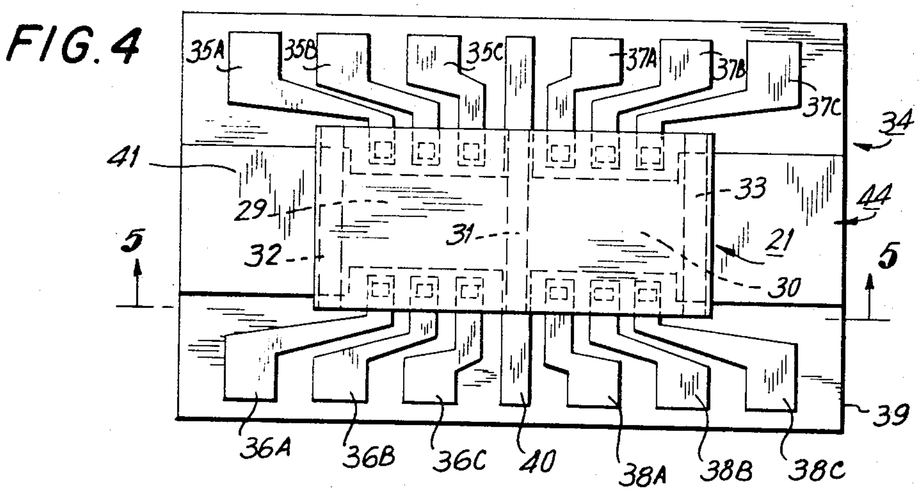
FIG. 4 is a plan view showing the integrated circuit of FIG. 3 assembled on the header depicted in FIG. 2.

Referring now more particularly to FIGS. 2 and 3 one embodiment of the invention is illustrated as comprising two semiconductor circuits 29 and 30 which are formed on the underside of the same integrated circuit chip 20. The circuit 29 corresponds to the RF amplifier and the circuit 30 corresponds to the oscillator circuit. The circuit 29 has a plurality of leads 21A, 21B, 21C, 22A, 22B, and 22C which are connected, respectively, to lead terminals 25A, 25B, 25C, 26A, 26B and 26C. The oscillator circuit 30 has a plurality of leads 23A, 23B, 23C, 24A, 24B and 24C which are connected, respectively, to lead terminals 27A, 27B, 27C, 28A, 28B and 28C. The leads and lead terminals are all disposed on the planar undersurface of the chip 20 (which is viewed upsidedown in FIG. 3).

The leads and lead terminals of the circuit 29 are shielded from the leads and the lead terminals of the circuit 30 by a shielding electrode 31 interposed between the two sets of leads and lead terminals and which is integral with the same planar surface of the integrated circuit chip on which the leads and terminals are disposed. The leads and the lead terminals of the circuits 29 and 30 are also shielded from outside signals by shielding electrodes 32 and 33, respectively, which are parallel to each other and to the electrode 31 and which are integral with and disposed at opposite ends of the planar underside of the chip 20. The shield electrodes 31, 32 and 33 preferably have the same thickness as the lead terminals 25A–26C and 27A–28C.

Figure 5:
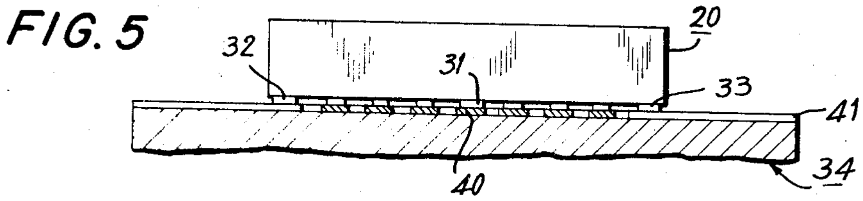
FIG. 5 is a side view partially in section taken generally along the line 5—5 in FIG. 4.

In order to give the chip 20 physical integrity it is mounted on a header 34 shown in FIG. 2. The header 34 is comprised of a substrate 39 made of ceramic material or glass or epoxy resin, for example. It has a plurality of outside leads 35A, 35B, 35C, 36A, 36B and 36C which are located on the upper surface of the substrate 39 and are positioned to engage the lead terminals 25A–26C, respectively, of the circuit 29. The second set of outside lead terminals 37A, 37B, 37C, 38A, 38B and 38C are also arranged on the upper surface of the substrate 39 in a pattern which corresponds to the arrangement of the lead terminals 27A–28C, respectively. The integrated circuit is assembled by inverting the chip 20 and placing it on the header 34 so that each of the respective lead terminals of the integrated circuit chip 20 contacts the corresponding outside leads 35A–38C on the substrate 39. The lead terminals of the chip are thereafter bonded to the outside leads of the header by any well known method, such as heat bonding. (FIG. 5).

The header 34 also has a shielding layer generally designated 44 which is substantially in the form of a cross symmetrically located on the upper surface of the substrate 39 in such a manner as to divide the surface into quadrants. The outside leads 35A–35C, 36A–36C, 37A–37C and 38A–38C are located in separate quadrants formed by the shielding layer 44. The shielding layer 44 has perpendicular arms 40 and 41 symmetrically located on the surface of the substrate 39.

The ends of the arm 41 are enlarged and are positioned to contact the shielding electrodes 32 and 33 when the circuit chip 20 is inverted and placed on the header 34. The cross arm 40 is also located to contact the shielding electrode 31 when the chip 20 is inverted and placed on the header 34. The conductive layers which form the outside leads 35A–38C are preferably designed to have the same thickness as the conductive shield layer 44. All of these layers are placed on the substrate 39 by the thick film technique which is well-known in the art.

Figure 6:
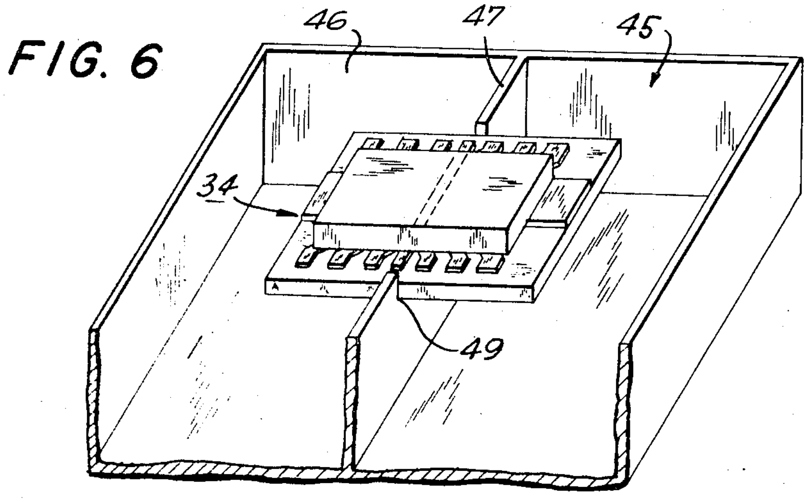
FIG. 6 is a perspective view of the embodiment of FIGS. 2–5 as installed in a television receiver tuner.

In FIG. 6 the assembled integrated circuit is installed in a two-part shielded chassis 45 having a cavity 46 and a cavity 48 separated by a wall 47. The wall 47 has a recess 49 in which the header 34 is installed together with the integrated circuit 20. The plane of the wall 47 is made to coincide with the plane of the shielding electrode 31 and the arm 40 of the shielding layer 44. This has the effect of completely shielding the two separate circuits 29 and 30 from the RF signals generated in each.

Referring now more particularly to FIGS. 7A–7E the process by which the lead terminals, such as the lead terminals 25A–28C and the shield electrodes 31–33 are manufactured on a semiconductor circuit chip are illustrated. Only a portion of the chip having one circuit is illustrated because the construction of the remaining portion is substantially similar. The semiconductor circuit is comprised of an N-type collector layer 50 deposited on top of a P-type layer 70. Deposited in the N-type layer 50 is a P-type base layer 51 and within the P-type base layer 51 is an N-type emitter layer 52. Each of these layers have separate aluminum electrodes 54 protruding through a common silicon-dioxide surface layer 57.

Within the N-type layer 50 is a region 56 of N+type material to which the collector electrode is attached. A layer of N+type material 55 is also interposed between the P-type substrate 70 and the N-type collector layer 50. The outer surface of the P-type layer 70 is covered with a layer of aluminum 72.

At the outer ends of the portion of the substrate 50 as viewed in FIGS. 7A–7E are two P-type regions 53 which are connected to aluminum electrodes 54. The regions 53 extend through the region 50 and into the region 70. The regions 53 act as electrical isolators and provide a low resistance path in the semiconductor chip to the circuit ground.

Figure 7A:
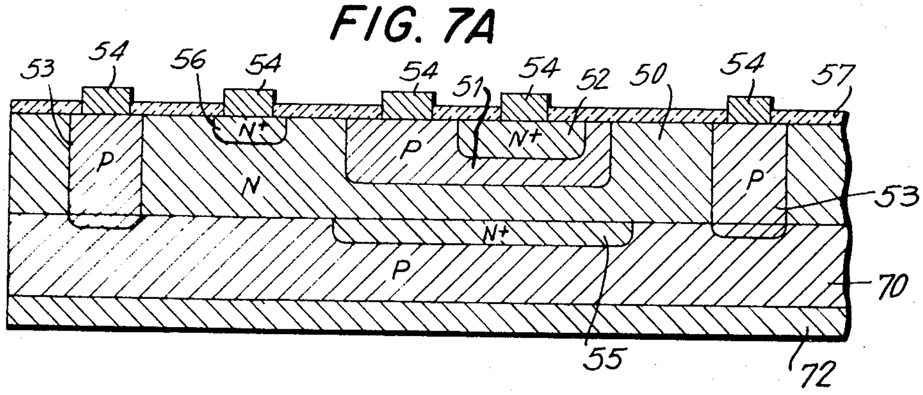
FIGS. 7A–7E are side views in section illustrating the steps in fabricating the integrated circuit chip depicted in FIG. 3.
Figure 7B:
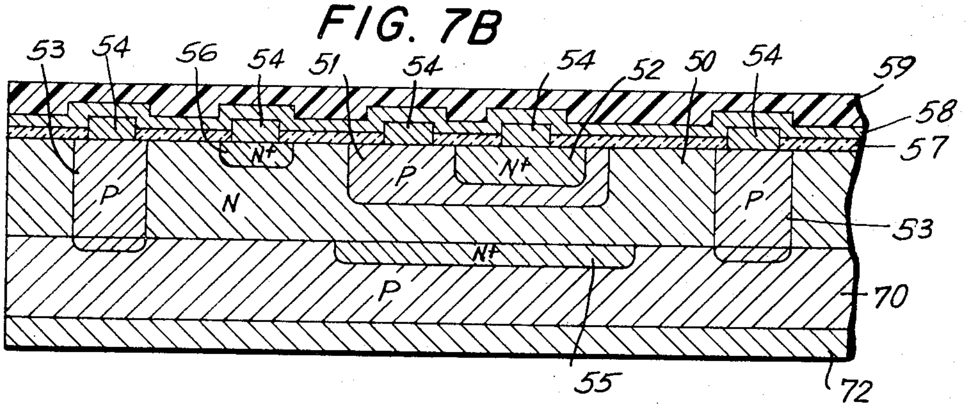

Referring now more particularly to FIG. 7B a layer of titanium 58 is formed on the surface of the aluminum electrodes 54 and the silicon-dioxide layer 57. Thereafter a layer of photosensitive resin 59 is formed over the layer of titanium 58.

Figure 7C:
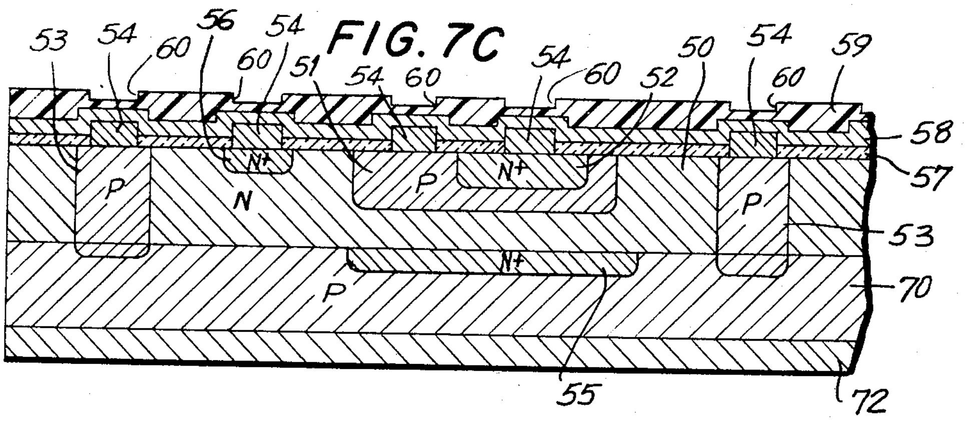

With reference to FIG. 7C the photosensitive resin layer 59 is selectively exposed to light, in the well known photo-resist manner, and is then selectively etched away in the areas which overlie the aluminum electrodes 54. A layer of nickel 60 is then plated over the holes which were etched in the photo-resist layer 59. This nickel layer is about 3 microns thick. The layer of titanium 58 serves to prevent the aluminum and nickel layers from alloying with each other. The thickness of the titanium layer is about 0.1 microns.

Figure 7D:
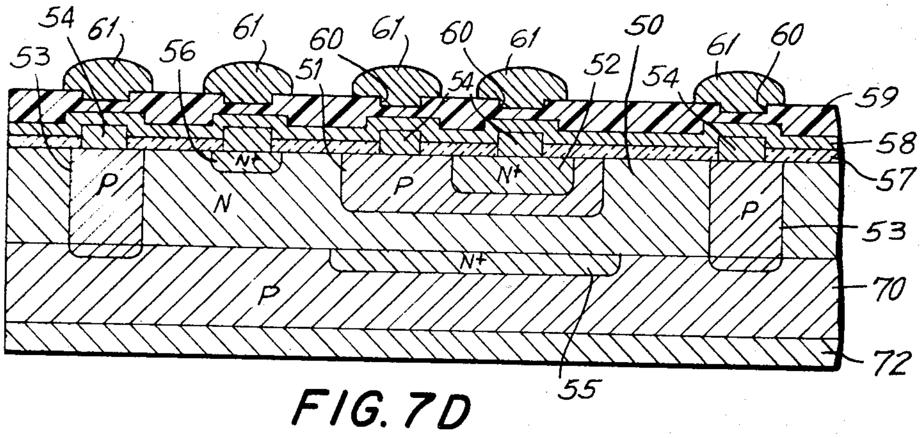
Figure 7E:
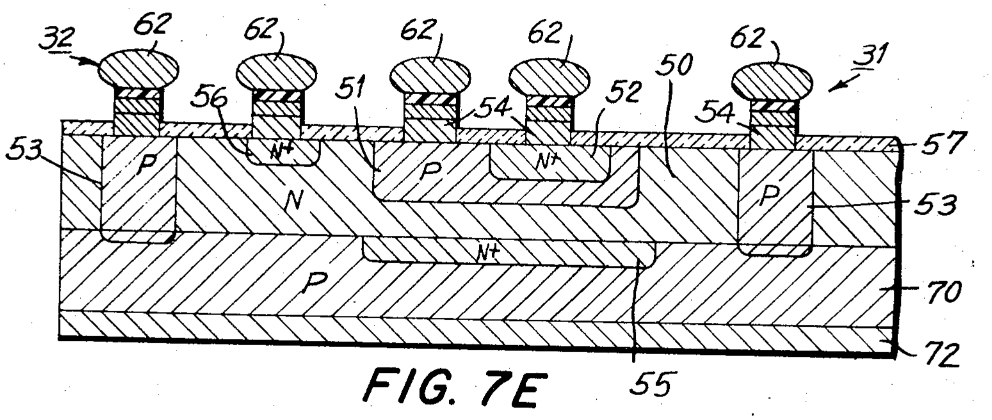

The next step of the process is illustrated in FIG. 7D in which a layer of tin 61 is plated on the nickel layers 60 to have a relatively large thickness. The remaining exposed portions of the photo-resist layer 59 are removed and the titanium layer is also etched down to the silicon-dioxide layer 57. The resultant circuit, as shown in FIG. 7E, is a portion of an integrated circuit having a plurality of raised contacts 62. The left and right outside contacts 62, as viewed in FIG. 7E, correspond to the shielding layers 32 and 31, respectively. It will be appreciated that the portion of the circuit illustrated in FIGS. 7A–7E comprises half of a circuit such as that shown in FIG. 3.

Figure 7F:
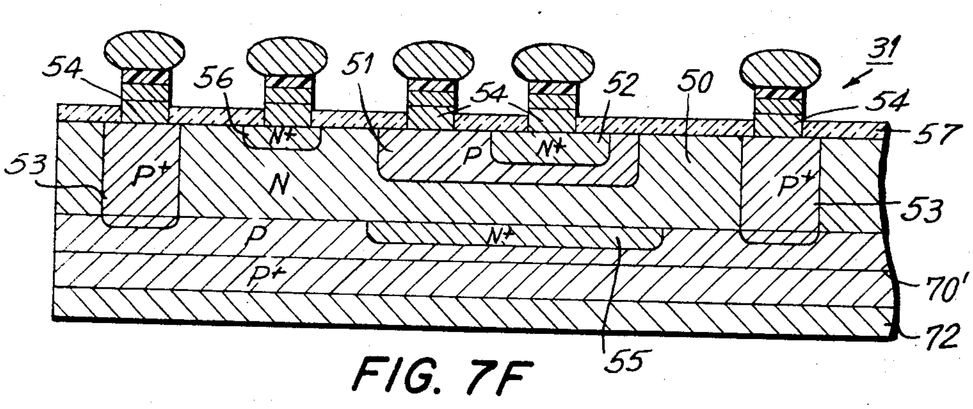
FIG. 7F is a side view in section illustrating another embodiment of the integrated circuit according to the invention.

Referring now more particularly to FIG. 7F a modified embodiment is illustrated in which the portions 53 are constituted of P+ type material instead of P- type material. Also the P- type substrate 70 should be formed instead with a P and P+ epitaxical growth substrate 70′ instead of merely a P- type substrate.

Figure 8:
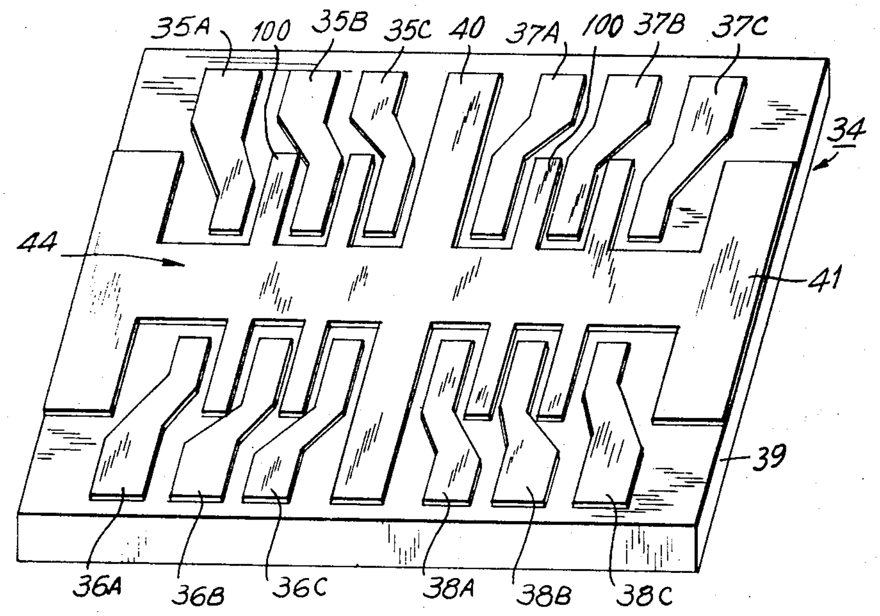
FIG. 8 is a perspective view of a header for mounting an integrated circuit according to a third embodiment of the invention.
Figure 9:
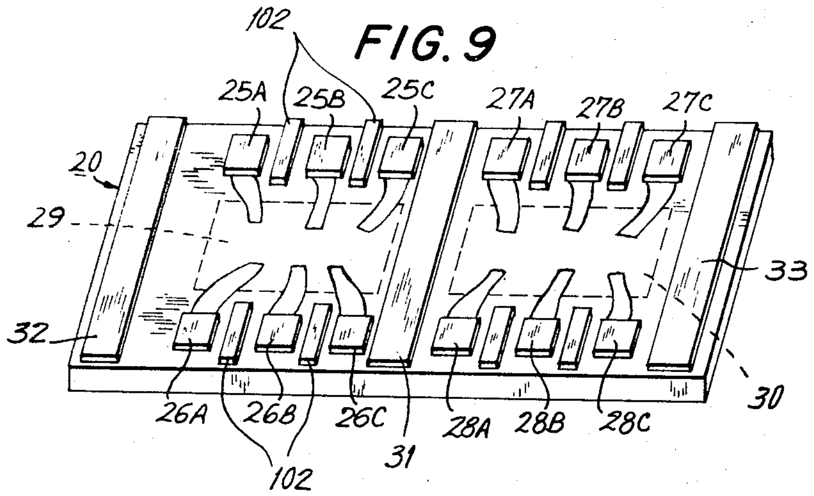
FIG. 9 is a perspective view of the underside of an integrated circuit for use with the header depicted in FIG. 9.

Referring now more particularly to FIGS. 8 and 9 a third embodiment of the invention is illustrated which is a modification of the embodiment of FIGS. 2–6. Corresponding reference numerals have therefore been used. In this embodiment the shielding layer 44 on the header 34 has a plurality of extensions 100 from the arm 41 in a comb-like pattern. The extensions 100 separate each of the respective outside leads 35A–38C from each other and shield each of the leads from the RF signals in the other leads. The semiconductor chip 20 also has a plurality of shielding layers 102 which separate the end terminals 25A–28C from each other and are located to coincide with the extensions 100 when the chip 20 is inverted and bonded to the header 34. Thus the shielding layers 102 are in contact with the respective extensions 100 to provide further shielding for the circuit.

Figure 10:
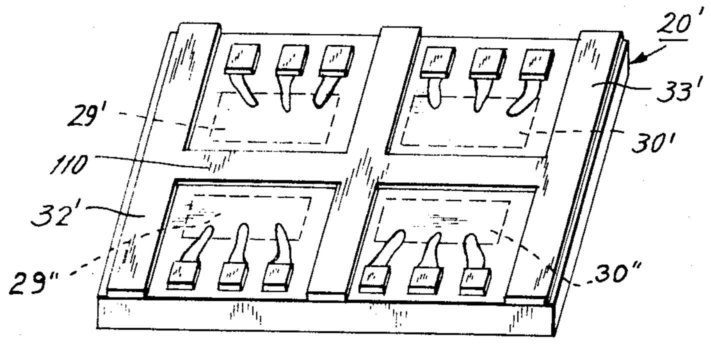
FIG. 10 is a perspective view of the underside of an integrated circuit according to a fourth embodiment of the invention.
Figure 11:
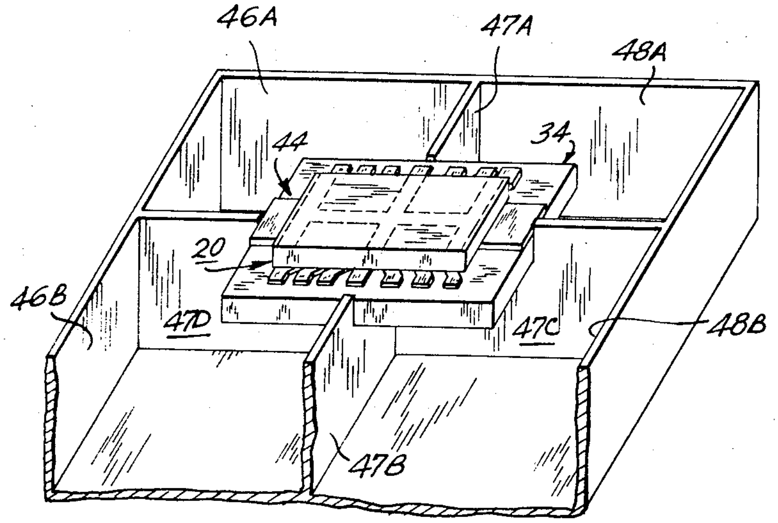
FIG. 11 is a perspective view showing the mounting of the integrated circuit of FIG. 10 in a television receiver tuner compartment.

Referring now more particularly to FIGS. 10 still another embodiment of the invention is illustrated. In this embodiment a semiconductor chip 20' has four circuits 29', 29'', 30' and 30''. Each of the four circuits is separately shielded by shielding layers 31'32' and 33' which correspond to the shielding layers 31, 32 and 33 in the embodiment depicted in FIG. 3. An additional shielding layer 110 extends perpendicular to the shielding layers 31–33 and connects with them to form separate quadrants for each of the circuits. The chip 20' is inverted and placed on a header such as the header 34. The complete assembly is mounted in a container having four separate cavities 46A, 46B, 48A and 48B divided by walls 47A, 47B, 47C and 47D which are interior walls. The chip 34 is located in recesses in the walls at their intersection such that the walls additionally serve to divide the header 34 into quadrants and to provide separate shielding for each of the circuits 29', 29'', 30' and 30''. (FIG. 11).

The terms and expressions which have been employed here are used as terms of description and not of limitation, and there is no intention in the use of such terms and expressions, of excluding equivalents of the features shown and described, or portions thereof, it being recognized that various modifications are possible within the scope of the invention claimed.

What is claimed is:

1. An integrated circuit device of the type having a body of semiconductor material which incorporates a plurality of separate circuits wherein the improvement comprises at least one radio frequency shield which is monolithic with the semiconductor body for shielding at least one of the circuits from radio frequency fields generated in another of the circuits.

2. An integrated circuit device as recited in claim 1 comprising a plurality of radio frequency shields for shielding at least one of the circuits from external radio frequency fields and from radio frequency fields generated in another of the circuits.

3. An integrated circuit device comprising a body of semiconductor material which incorporates a plurality of integrated circuits, the semiconductor body having at least one planar surface, each of the circuits having a plurality of separate leads which terminate at the planar surface of the semiconductor body, first means integral with the planar surface of the semiconductor body for shielding at least one of the integrated circuits from radio frequency fields generated in another of the integrated circuits and means for mounting the semiconductor body.

4. An integrated circuit device as recited in claim 3 wherein each of the plurality of leads for each of the integrated circuits projects outwardly from the planar surface by a predetermined distance and the first means for shielding include parallel members of electrically conductive material which project outwardly from the planar surface of the semiconductor body by an amount which is at least equal to the distance of projection of the terminals of the leads to the integrated circuits.

5. An integrated circuit device as recited in claim 3 wherein the means for mounting the semiconductor body includes a substrate of material having at least one planar surface and second means for shielding at least select ones of the plurality of integrated circuits from the radio frequency fields generated in others of the plurality of integrated circuits, the second means for shielding including members made of conductive material which are integral with the planar surface of the mounting substrate and project from it by a predetermined distance.

6. An integrated circuit device as recited in claim 3 wherein the semiconductor body includes a first layer of semiconductive material of a first polarity type, a second layer of semiconductive material of a second polarity type which is adjacent to the first layer, and the first means for shielding further includes a first and a second portion of the second polarity type which extend from the planar surface of the semiconductor body through the first layer of material to contact the second layer of material.

7. An integrated circuit device as recited in claim 3 wherein the first means for shielding include a plurality of individual members of conductive material which are integral with the planar surface of the semiconductor body and which project from it by a predetermined amount, each of the plurality of shielding members being located between a separate pair of the plurality of lead terminals of the integrated circuits.

8. An integrated circuit device as recited in claim 7 wherein the mounting means includes a plurality of shielding members located on its planar surface to coincide with the plurality of shielding members on the semiconductor body when the semiconductor body is mounted on the mounting means.

9. An integrated circuit as recited in claim 3 wherein the first shielding means includes an additional member which is integral with the planar surface of the semiconductor body and projects from it by the predetermined distance, is perpendicular to at least two of the plurality of members, and shields a first one of the integrated circuits from the radio frequency fields generated in a second of the integrated circuits.

* * * * *